000

United States Patent
Lin et al.

(10) Patent No.: US 11,892,508 B2
(45) Date of Patent: Feb. 6, 2024

(54) JOINT TEST ACTION GROUP TRANSMISSION SYSTEM CAPABLE OF TRANSMITTING DATA CONTINUOUSLY

(71) Applicant: Realtek Semiconductor Corp., HsinChu (TW)

(72) Inventors: Chen-Tung Lin, HsinChu (TW); Yuefeng Chen, Suzhou (CN)

(73) Assignee: Realtek Semiconductor Corp., HsinChu (TW)

( * ) Notice: Subject to any disclaimer, the term of this patent is extended or adjusted under 35 U.S.C. 154(b) by 672 days.

(21) Appl. No.: 17/094,770

(22) Filed: Nov. 10, 2020

(65) Prior Publication Data

US 2021/0148978 A1 May 20, 2021

(30) Foreign Application Priority Data

Nov. 20, 2019 (CN) .......................... 201911141023.3

(51) Int. Cl.
*G01R 31/28* (2006.01)
*G01R 31/3185* (2006.01)
*G01R 31/317* (2006.01)

(52) U.S. Cl.
CPC .............. *G01R 31/318555* (2013.01); *G01R 31/31705* (2013.01)

(58) Field of Classification Search
CPC ................. G01R 31/318555; G01R 31/31705
See application file for complete search history.

(56) References Cited

U.S. PATENT DOCUMENTS

| | | | |
|---|---|---|---|
| 6,430,727 B1 * | 8/2002 | Warren | G06F 11/3648 |
| | | | 714/39 |
| 6,704,895 B1 | 3/2004 | Swoboda | |
| 7,065,675 B1 | 6/2006 | Thekkath | |
| 7,451,367 B2 | 11/2008 | Pedersen | |
| 7,900,106 B2 | 3/2011 | Halstvedt | |
| 8,055,963 B2 | 11/2011 | Halstvedt | |
| 2013/0139015 A1 * | 5/2013 | Vaccaro | G01R 31/318558 |
| | | | 714/E11.155 |
| 2017/0115343 A1 * | 4/2017 | Chen | G11C 29/46 |

FOREIGN PATENT DOCUMENTS

EP     0 854 422 B1    4/2004

\* cited by examiner

*Primary Examiner* — Christine T. Tu
(74) *Attorney, Agent, or Firm* — Winston Hsu (57) ABSTRACT

A joint test action group transmission system includes a host terminal and a slave terminal. The slave terminal includes a test access port (TAP) circuit, an internal memory, and a memory interface controller. The TAP circuit includes a test data register set. The memory interface controller stores the data received from the TAP circuit to the internal memory. The host terminal transmits a set of download instruction bits to the TAP circuit to have the TAP circuit select the test data register set, and have the TAP circuit enter a data shift status to receive a data package through the test data register set. During the process of receiving the data package, the TAP circuit remains in the data shift status to receive the address and at least one piece of data stored in the data package continuously.

14 Claims, 4 Drawing Sheets

FIG. 4

JOINT TEST ACTION GROUP TRANSMISSION SYSTEM CAPABLE OF TRANSMITTING DATA CONTINUOUSLY

BACKGROUND OF THE INVENTION

1. Field of the Invention

The present invention is related to a joint test action group (JTAG) transmission system, and more particularly to a joint test action group (JTAG) transmission system capable of transmitting data continuously.

2. Description of the Prior Art

In prior art, Joint Test Action Group (JTAG) can transmit data in series. The interface defined by JTAG includes a data input terminal, a data output terminal, a reset terminal, a clock signal terminal, and a mode selection terminal. Generally, to transmit the test data with the interface of JTAG, the system is installed with a test access port (TAP) circuit on the device to be tested. The TAP circuit can control the internal registers with the interface defined by JTAG so that the data stored in the device to be tested can be outputted and captured for testing and debugging.

In general, the TAP circuit receives the mode selection signal and the data in a serial manner so the operations are less flexible. For example, when the host unit needs to store a piece of data to the device to be tested, the host unit has to transmit a series of mode selection signals to the TAP circuit, and the TAP circuit will be switched among different statuses to receive the data and store it to the memory according to the address. In this case, if the host unit needs to transmit several pieces of data to the memory of the device to be tested, it will be very time-consuming due to the repeated operations required by the TAP circuit.

SUMMARY OF THE INVENTION

One embodiment of the present invention discloses a joint test action group (JTAG) transmission system. The JTAG transmission system includes a slave unit and a host unit.

The slave unit includes a test access port, a memory, and a memory interface controller. The test access port (TAP) circuit includes a data input terminal, a clock terminal, a mode selection terminal, and a test data register set. The memory interface controller is coupled to the test access port circuit and the memory. The memory interface controller stores data transmitted from the test access port circuit to the memory.

The host unit is coupled to the data input terminal, the clock terminal, and the mode selection terminal. The host terminal transmits a download instruction set to the test access port circuit to have the test access port circuit select the test data register set, and has the test access port circuit enter a data shift status to receive a data package through the test data register set.

The data package includes an address and at least one piece of write data. During a process of receiving the data package, the test access port circuit remains in the data shift status to continuously receive the address and the at least one piece of write data in the data package.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
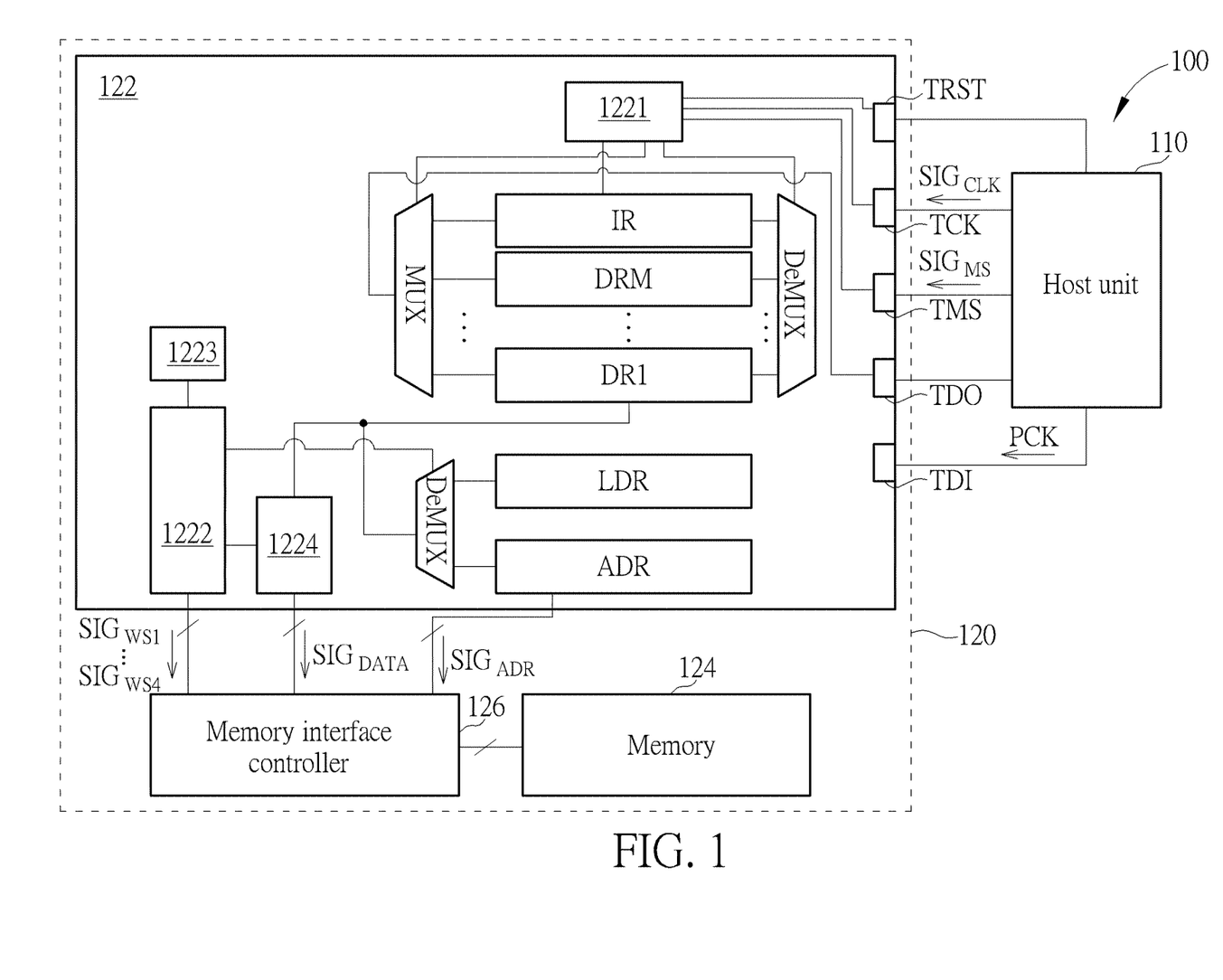
FIG. 1 shows a joint test action group (JTAG) transmission system according to one embodiment of the present invention.

FIG. 1 shows a joint test action group (JTAG) transmission system 100 according to one embodiment of the present invention. The JTAG transmission system 100 can include a host unit 110 and a slave unit 120. In some embodiments, the host unit 110 can transmit the test data to the slave unit 120 so that the slave unit 120 can perform computations or operations accordingly and the results of the computations or the operations can be captured by the host unit 110 for testing or debugging.

In FIG. 1, the slave unit 120 can include a TAP circuit 122, a memory 124, and a memory interface controller 126. The TAP circuit 122 can be coupled to the host unit 110 through the interface defined by JTAG. For example, the host unit 110 can be coupled to the data input terminal TDI, the data output terminal TDO, the clock terminal TCK, the reset terminal TRST, and the mode selection terminal TMS of the TAP circuit 122.

Furthermore, the TAP circuit 122 can include a first controller 1221, a plurality of test data register sets DR1 to DRM, and an instruction register set IR, where M is a positive integer. The host unit 110 can transmit a mode selection signal $SIG_{MS}$ to the TAP circuit 122 through the mode selection terminal TMS, and transmit a clock signal $SIG_{CLK}$ to the TAP circuit 122 through the clock terminal TCK. The first controller 1221 can read the mode selection signal $SIG_{MS}$ according to the clock signal $SIG_{CLK}$ received from the clock terminal TCK, and can control the test data register sets DR1 to DRM and the instruction register set IR according to the mode selection signal $SIG_{MS}$. In some embodiments, each of the test data register sets DR1 to DRM and the instruction register set IR can include a plurality of shift registers coupled in series; therefore, the first controller 1221 can read and write the test data register sets DR1 to DRM and the instruction register set IR by performing shift operations.

Generally, in the applications of JTAG, the first controller 1221 can include a finite state machine. The finite state machine can have a plurality of predetermined statuses, and the finite state machine can switch among different statuses according to the mode selection signal $SIG_{MS}$. Generally, the finite state machine of the first controller 1221 can have predetermined statuses such as reset status, idle status, instruction register set selection status, and test data register set selection status. In this case, the first controller 1221 can write a value received from the data input terminal TDI to the instruction register set IR by performing capture operations and shift operations to the instruction register set IR so that a corresponding test data register set can be selected.

For example, in FIG. 1, the demultiplexer DeMUX and the multiplexer MUX can build corresponding paths according to the values stored in the instruction register sets so the corresponding test data register set can be selected to perform capture operations or shift operations. For instance, if there are 32 test data register sets DR1 to DRM (that is, X equals to 32), then the instruction register set IR may include 5 registers to store 5 bits of data for representing 32 different values corresponding to the 32 test data register sets. However, in some other embodiments, the instruction register set IR can include more or less registers according to the system requirement.

In some embodiments, to perform write operations and read operations to the memory 124, one must follow the predetermined rules and the predefined timing, which can be rather complicated. In this case, the slave unit 120 can store the data in the test data register sets DR1 to DRM to the memory 124 with the memory interface controller 126. That is, the memory interface controller 126 can be coupled to the TAP circuit 122 and the memory 124, and the memory controller 126 can cope with the complicated rules and timings required by the memory 124, and store the data transmitted from the TAP circuit 122 to the memory 124.

In some embodiments, if the host unit 110 needs to store a piece of write data to a specific address in the memory 124 of the slave unit 120, the host unit 110 can control the TAP circuit 122 to select a test data register set from the test data register sets DR1 to DRM, and store the write address to the selected test data register set by performing shift operations. Later, the TAP circuit 122 will leave the shift status, select another test data register set, and then store the write data to the newly selected test data register set.

Figure 2:
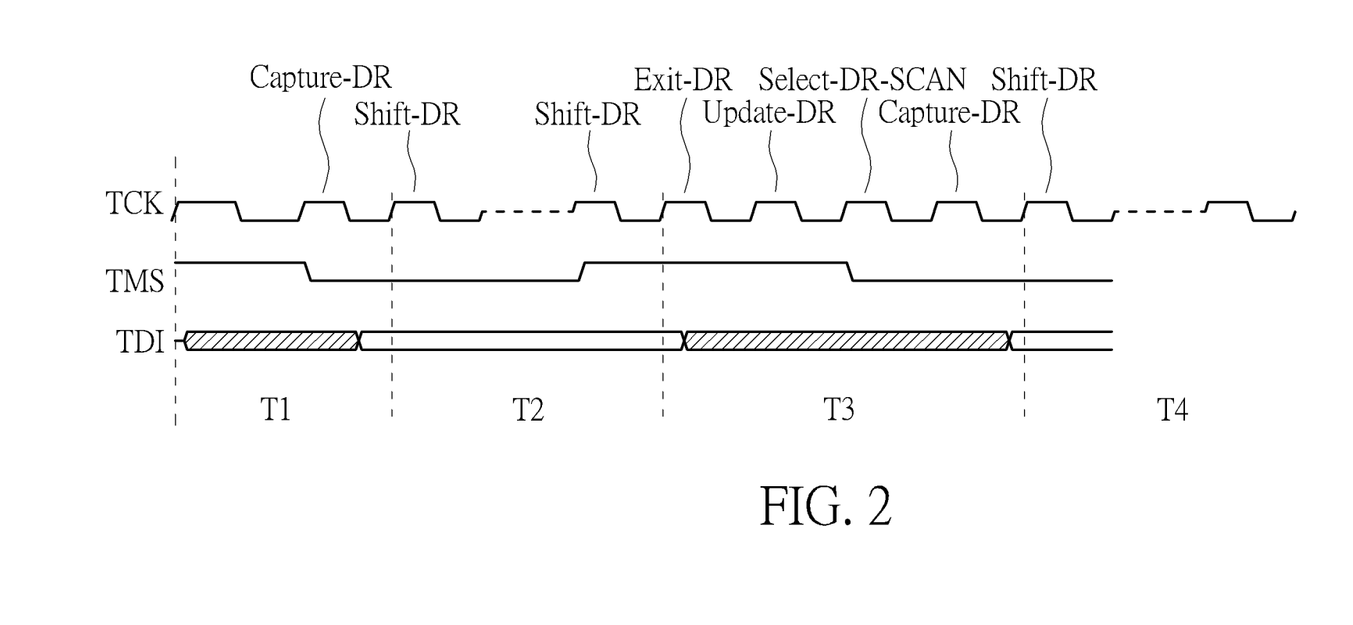
FIG. 2 shows a timing diagram for transmitting a write address and a piece of write data from the host unit to the test access port circuit.

FIG. 2 shows a timing diagram for transmitting a write address and a piece of write data from the host unit 110 to the TAP circuit 122. In FIG. 2, during periods T1 and T3, the TAP circuit 122 can perform operations to select a corresponding test data register set. For example, the Select-DR-SCAN operation for selecting the test data register set and the capture-DR operation for capturing data may be performed. Also, after the data has been written to the selected test data register set, some regular operations, such as the exit-DR operation for exiting the selected test data register set and the update-DR operation for updating the test data register set, will be performed. That is, in FIG. 2, the time that the TAP circuit 122 spends on performing shift-DR operations for actually receiving the address and write data is periods T2 and T4. In this case, when the host unit 110 needs to transmit successive pieces of write data to the memory 124 of the slave host 120, it will take lots of time performing regular operations to the TAP circuit 122.

In some embodiments, to improve the efficiency of data transmission, the host unit 110 can transmit a download instruction set to the mode selection terminal TMS so that the TAP circuit 122 can select a corresponding test data register set and enter the shift-DR status for receiving and storing a data package PCK including the address and at least one piece of write data to the selected test data register set. In addition, during the process of receiving the data package PCK, the TAP circuit 122 can remain in the shift-DR status for continuously receiving the data of the data package PCK without spending additional time on performing redundant operations before and after the address or each piece of write data is received.

In some embodiments, the JTAG transmission system 100 can assign one of the test data register sets DR1 to DRM, for example, the test data register DR1, to be used specifically for continuous download operations. In this case, the first controller 1221 can select the test data register set DR1 according to the download instruction sets transmitted from the host unit 110 and start the continuous download operation by using the test data register set DR1 capturing the data received from the data input terminal TDI. In addition, in order to receive the address and the write data continuously, the TAP circuit 122 can further include a second controller 1222, a counter 1223, and an address register set ADR.

The second controller 1222 includes a finite state machine. In the present embodiment, when the first controller 1221 has the test data register set DR1 start to capture data received from the data input terminal TDI and has the TAP circuit 122 enter the data shift status, the second controller 1222 will enter the address receiving status and reset the counter 1223. In the data receiving status, the second controller 1222 can increment the counter 1223 when the clock terminal TCK receives the clock signal $SIG_{CLK}$. For example, the second controller 1222 can increment the counter 1223 by 1 whenever a rising edge of the clock signal $SIG_{CLK}$ is encountered. Since the address width of the memory 124 is usually fixed, the second controller 1222 can determine whether the address carried by the data package PCK has been stored to the test data register set DR1 completely according to the value of the counter 1223 and the address width.

For example, if the address width of the address is 32 bits, then according to the operations aforementioned, when the value of the counter 1223 becomes 31, it may imply that the TAP circuit 122 has received 32 bits of data from the data input terminal TDI. Therefore, the TAP circuit 122 should have received the 32 bits of address completely. In addition, after the address is stored to the test data register set DR1 completely, the second controller 1222 can store the value stored in the test data register set DR1 to the address register set ADR. Meanwhile, the address receiving status for receiving the address would be ended, and the second controller 1222 will enter the data receiving status for receiving the write data.

In some embodiments, each piece of the write data in the data package PCK can have the same data width that corresponds to the data width of the memory 124. In this case, the second controller 1222 can reset the counter 1223 before entering the data receiving status, and increment the counter 1223 whenever the clock signal $SIG_{CLK}$ is received in the data receiving status. Consequently, the second controller 1222 can determine whether a piece of write data has been stored to the test data register set DR1 completely according to the data width of the write data and the value of the counter 1223. When the second controller 1222 determines that the first piece of write data of the data package PCK has been stored to the test data register set DR1 completely, the values stored in the test data register set DR1 and the value stored in the address register set ADR can be transmitted to the memory interface controller 126. That is, the data signal $SIG_{DATA}$ and the address signal $SIG_{ADR}$ can be transmitted to the memory interface controller 126, and the memory interface controller 126 can store the first piece of write data to the memory 124 according to the address recorded in the address register set ADR.

In the present embodiment, the data package PCK can further include a second piece of write data. Therefore, after the second controller 1222 has the first piece of write data transmitted to the memory interface controller 126, the second controller 1222 can remain in the data receiving status to receive the second piece of write data continuously. In some embodiments, after the first piece of write data has been stored to the test data register set DR1, the second controller 122 can increment the address recorded in the address register set ADR according to the data width and reset the counter 1223. Similarly, the second controller 1222 can increment the counter 1223 by 1 whenever the clock signal $SIG_{CLK}$ is received (for example, whenever the rising edge of the clock signal $SIG_{CLK}$ is encountered), and the second controller 1222 can determine whether the second piece of write data has been stored to the test data register set DR1 completely according to the value of the counter 1223 and the data width. After the second piece of write data is stored to the test data register set DR1, the second controller 1222 can transmit the value stored in the test data register set DR1 and the value stored in the address register set ADR to the memory interface controller 126 so that the second piece of write data can be stored to the space next to the first piece of write data in the memory 124.

Similarly, if there are more pieces of write data in the data package PCK, the second controller 1222 can use similar operations aforementioned to receive following data without being interrupted. In some embodiments, the second controller 1222 can receive the data continuously and will only stop receiving the data when the host unit 110 sends a mode selection signal $SIG_{MS}$ to demand the TAP circuit 122 leave the data receiving status and enter the data updating status. That is, the host unit 110 can activate the continuous download operation by selecting the predefined test data register set, allowing the TAP circuit 122 to remain in the data shifting status and receive the data in the data package PCK from the data input terminal TDI continuously without being interrupted by reselecting other test data register sets or other regular operations.

Figure 3:
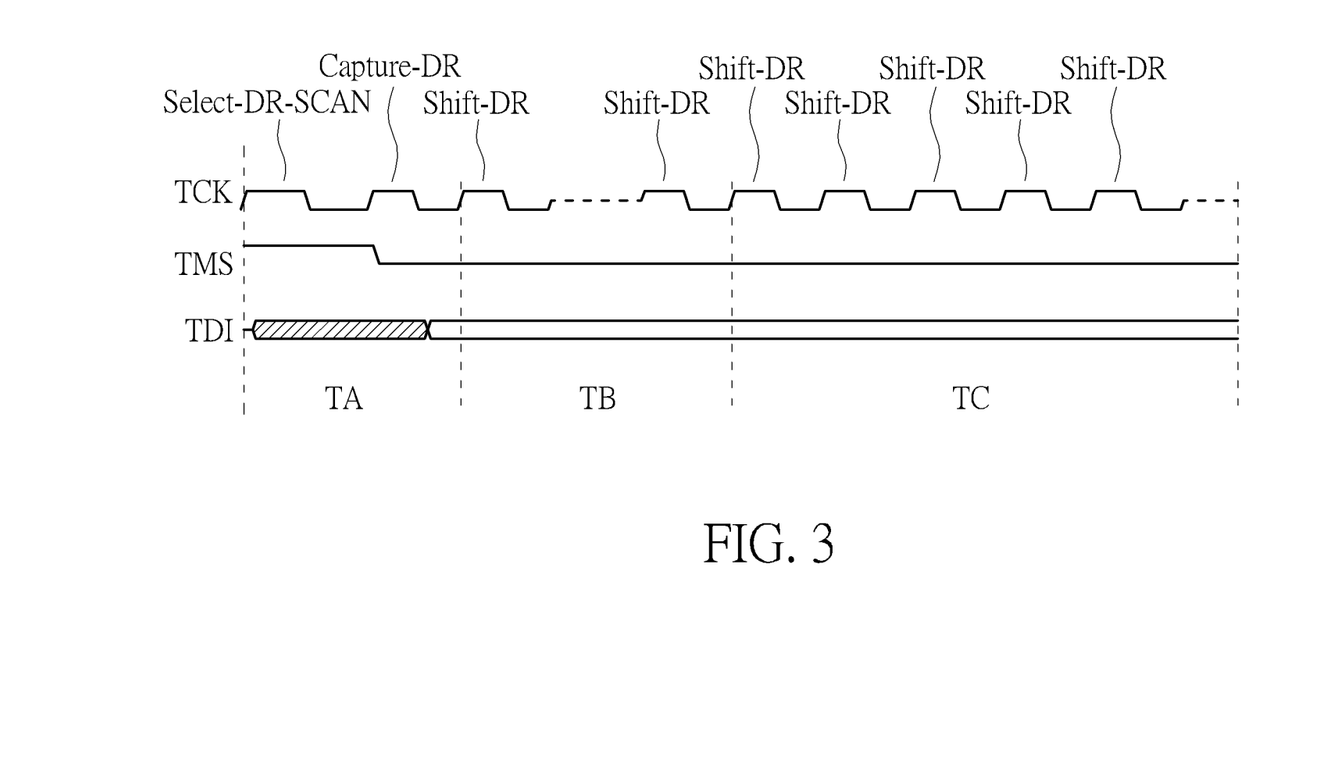
FIG. 3 shows a timing diagram for transmitting a write address and a piece of write data from the host unit to the test access port circuit according to another embodiment of the present invention.

FIG. 3 shows a timing diagram for transmitting a write address and a piece of write data from the host unit 110 to the TAP circuit 122 according to another embodiment of the present invention. In FIG. 3, the TAP circuit 122 can select the test data register set DR1 during period TA, and start to receive the address and the write data in periods TB and TC respectively. Comparing to FIG. 2, the continuous download operation performed in FIG. 3 allows the JTAG transmission system 100 to reduce the time for regular operations, thereby improving the transmission efficiency.

In some embodiments, the data width of the write data, the data width of the memory 124, and the data width of the test data register set DR1 can be corresponding to one another, for example, the data widths of these three can all be X bits. However, the unit of the address space in the memory 124 can be Y bits. In this case, the memory 124 would require S units of address spaces to store the full X bits of data, where S can be represented as $2^Z$, where X, Y, S, and Z are positive integers, and X equals to the product of Y and S.

For example, X can be 32, Y can be 8, S can be 4, and Z can be 2. That is, the data width of the write data and the data width of the memory 124 can be 32 bits; however, in the memory 124, each address space can store 8 bits of data, that is, the unit of the address space is one byte. In this case, the memory 124 would require 4 address spaces (each stores one byte of data) to store the total 32 bits of data. Therefore, in the embodiments aforementioned, when the host unit 110 needs to store the first piece of write data (32 bits of data) to the address 0X80000000 (represented in hexadecimal), the first piece of write data will actually occupy the address spaces of 0X80000000, 0X80000001, 0X80000002, and 0X80000003. Also, when the host unit 110 needs to store the second piece of write data (another 32 bits of data), the address will be updated from 0X80000000 to 0X80000004, so the second piece of write data will be stored to the address spaces of 0X80000004, 0X80000005, 0X80000006, and 0X80000007.

However, in some embodiments, the host terminal 110 can write 24 bits of data to the address spaces 0X80000001, 0X80000002, and 0X80000003, write 16 bits of data to the address spaces 0X80000002, 0X80000003, or write 8 bits of data to the address space 0X80000003. In these cases, to transmit write data having different data widths flexibly, the second controller 1222 can identify the effective data width of the first piece of write data according to the write address and adjust the value of the counter 1223 so that the first piece of write data can be received correctly after the write address is received.

In some embodiments, in the address receiving status, when the write address has been stored to the address register set ADR, the second controller 1222 can adjust the value of the counter 1223 according to the address. For example, if the full data width is X bits and the unit of the address space of the memory 124 is Y bits, then the last Z bits of the write address can be used to predict the number of effective bits in the first piece of write data. For example, the first piece of write data should include P sets of Y bits of data, where P equals to $2^Z$ minus the value of the last Z bits of the address. In this case, the second controller 1222 can set the initial value of the counter 1223 to be the product of Y and the value of the last Z bits of the address.

For example, if X equals to 32, Y equals to 8, S equals to 4, and Z equals to 2, and the write address received by the second controller 1222 is 0X80000001, then P should be 3, that is, S-1 or 4-1, implying that the data width of the first piece of write data should include only 3 sets of Y bits of effective data, which would be 24 bits in total. Also, the 3 sets of Y bits of data should be stored to the address spaces of 0X80000001, 0X80000002, and 0X80000003.

In this case, the second controller 1222 can set the value of the counter 1223 to be the product of 1 (the value of the last Z bits of the address is 1) and 8. Therefore, the counter 1223 will be incremented from 8. Consequently, when the value of the counter equals to X−1, that is 31, it can still indicate that the TAP circuit 122 has received all the 24 bits of the first piece of write data. Therefore, the second controller 1222 can determine that the first piece of write data has been stored to the test data register set DR1 completely, and can receive the second piece of data continuously. In addition, when storing the second piece of write data to the memory 124, the second controller 1222 can set the last two bits of the address to be "00" and then plus 4. That is, the second piece of write data will be stored to the address spaces starting from 0X80000004 next to the first piece of write data. In some embodiments, since the memory interface controller 126 may always send the address to the memory 124 with the last two bits being 0, the second controller 1222 may ignore the last two bits of the address and only plus 1 to the last third bit when incrementing the address.

Consequently, the host unit 110 can continuously write data to the memory 124 of the slave unit 120 starting from any addresses, making the JTAG transmission system even more flexible. Furthermore, due to the limitation of hardware, the TAP circuit 122 may be coupled to the memory interface controller 126 through buses or transmission lines having fixed data width. For example, in FIG. 1, the data signal $SIG_{DATA}$ transmitted by the TAP circuit 122 has a fixed data width. In this case, even if the number of effective bits in the first piece of write data is less than X, the second controller 1222 may still need to transmit X bits of data to the memory interface controller 126. In this case, to identify the effective bits of data, the second controller 1222 can further output S write valid signals corresponding to the S units of storage space so as to mark the effective P sets of Y bits of data in the test data register set DR1.

For example, the write valid signal can have a first value by default. The first value can be, for example but not limited to, "0". In the data receiving status, when the value of the counter 1223 equals to the product of Y and n minus 1, the second controller 1222 would change the value of the $n^{th}$ write valid signal to be a second value, for example but not limited to "1", where n is a positive integer smaller than or equal to $2^Z$. That is, when the value of the counter 1223 becomes Y−1, the first write valid signal will be updated from the default value "0" to be "1", meaning that the Y bits of data corresponding to the first write valid signal should be effective and valid. Also, when the value of the counter 1223 becomes 2Y−1, the second write valid signal will be updated from the default value 0 to be 1, meaning that the Y bits of data corresponding to the second write valid signal should be effective and valid, and so on.

Figure 4:
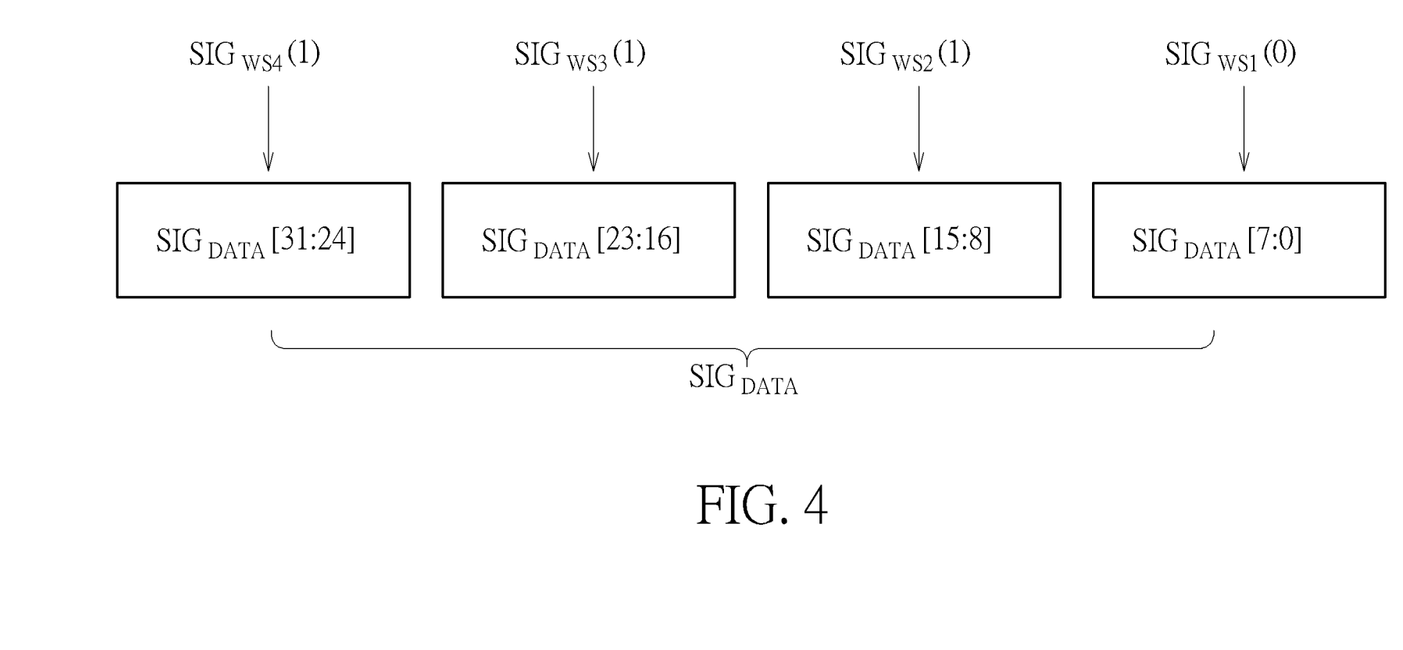
FIG. 4 shows the write valid signals and the corresponding parts of the data signal.

FIG. 4 shows the write valid signals $SIG_{WS1}$, $SIG_{WS2}$, $SIG_{WS3}$, and $SIG_{WS4}$ and the corresponding parts of the data signal $SIG_{DATA}$. In FIG. 4, when the second controller 1222 receives the write address of 0X80000001, it may imply that the data width of the first piece of write data should be 24 bits, which includes 3 sets of 8-bit data. In this case, the second controller 1222 will set the value of the counter 1223 to be 8, so the counter 1223 will be incremented from 8. During the process of receiving the first piece of data, as the value of the counter 1223 keeps increasing to 31, the write valid signals $SIG_{WS2}$, $SIG_{WS3}$, and $SIG_{WS4}$ will be changed to the second value "1" when the value of the counter becomes 15, 23, and 31 respectively, implying that the data signal $SIG_{DATA}[31:24]$, $SIG_{DATA}[23:16]$, and $SIG_{DATA}[15:8]$ are valid and effective. However, since the counter 1223 is incremented from 8, the condition for the write valid signal $SIG_{WS1}$ to change from the first value "0" to the second value "1" will not be met. Therefore, the write valid signal $SIG_{WS1}$ will still have the first value "0", and the corresponding part of data signal $SIG_{DATA}[31:24]$ is invalid and ineffective. Consequently, the memory interface controller 126 can write the valid parts of data signals $SIG_{DATA}[31:24]$, $SIG_{DATA}[23:16]$, and $SIG_{DATA}[15:8]$ to the address of 0X80000001, 0X80000002, and 0X80000003 in the memory 124 according to the write valid signals $SIG_{WS2}$, $SIG_{WS3}$, and $SIG_{WS4}$, and will not write data to the address 0X80000000 in the memory 124.

In some embodiments, the test data register set DR1 can receive data with a first-in first-out manner, and the test data register set DR1 can store 32 bits of data in total. In this case, if the first piece of write data has only 24 bits of valid data, then the 24 bits of data of the first piece of write data will be stored to the test data register sets DR1[23:0], and may be sent to the memory interface controller 126 as data signal $SIG_{DATA}[31:8]$, causing data mismatch. In FIG. 1, to correct the mismatch, the TAP circuit 122 can further include a signal rearrangement unit 1224. The signal rearrangement unit 1224 can control the corresponding relations between the data stored in the test data register set DR1 and the data signal $SIG_{DATA}$ according to the last two bits of the address stored in the address register set ADR so as to ensure the data signal $SIG_{DATA}$ can be generated correctly no matter which part of the first piece of write data is valid.

In some embodiments, the host unit 110 can further add the information of data length to the data package PCK so the TAP circuit 122 can be aware of the length of data to be received directly. For example, in FIG. 1, the TAP circuit 122 can further include a data length register set LDR. In some embodiments, when the address receiving status is completed, the second controller 1222 can enter the data length receiving status for receiving the data length value. In the data length receiving status, the second controller 1222 can increment the counter 1223 when the rising edge of the clock signal $SIG_{CLK}$ is received, and the second controller 1222 can determine whether the data length value has been stored to the test data register set DR1 completely according to the data width of the data length value and the counter 1223. When the data length value has been stored to the test data register set DR1, the second controller 1222 will store the value in the test data register set DR1 to the data length register set LDR, reset the counter 123, and enter the data receiving status for receiving the write data in the data package PCK.

Since the second controller 1222 can be aware of the length of the write data in the data package PCK according to the data length value, the second controller 1222 can confirm if the write data in the data package PCK has all been received accordingly, and leave the data receiving status after the confirmation. Also, in some embodiments, even if the data package PCK includes the data length value, the second controller 1222 can still terminate the data length receiving status when the host unit 110 demands the TAP circuit 122 to leave the data shifting status.

Furthermore, in some embodiments, the data package PCK can include a checking code, such as a check sum or a cyclic redundancy check, and the TAP circuit 122 or the memory interface controller 126 can verify the correctness of the write data according to the checking code.

In summary, the JTAG transmission system provided by the embodiments of the present invention can perform a continuous download operation, which allows the host unit to transmit an address and a plurality of pieces of write data to the slave unit continuously. Therefore, the regular operations performed between the transmissions of each two pieces of data can be omitted, thereby reducing the transmission time and improving the transmission efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A joint test action group (JTAG) transmission system comprising:
 a slave unit comprising:
  a test access port (TAP) circuit comprising a data input terminal, a clock terminal, a mode selection terminal, a first controller, a counter, an address register set, a second controller, and a test data register set;
  a memory;
  a memory interface controller coupled to the test access port circuit and the memory, and configured to store data transmitted from the test access port circuit to the memory; and
 a host unit coupled to the data input terminal, the clock terminal, and the mode selection terminal, and configured to transmit a download instruction set to the test access port circuit to have the test access port circuit select the test data register set, and have the test access port circuit enter a data shift status to receive a data package through the test data register set;
 wherein:
  the data package comprises an address and at least one piece of write data;

during a process of receiving the data package, the test access port circuit remains in the data shift status to continuously receive the address and the at least one piece of write data in the data package;
the first controller is configured to select the test data register set according to the download instruction set and have the test data register set capture data received from the data input terminal; and
the second controller is configure to:
  enter an address receiving status and reset the counter when the first controller has the test data register set start to capture the data received from the data input terminal and has the test access port circuit enter the data shift status;
  increment the counter when the clock terminal receives a clock signal in the address receiving status;
  determine whether the address has been stored to the test data register set completely according to a value of the counter and an address width of the address; and
  when the address has been stored to the test data register set completely, store a value stored in the test data register set to the address register set and complete the address receiving status.

2. The joint test action group transmission system of claim 1, wherein the second controller is further configured to:
  enter a data receiving status when the address receiving status is completed;
  in the data receiving status, increment the counter when the clock terminal receives the clock signal;
  determine whether a first piece of write data of the at least one piece of write data has been stored to the test data register set completely according to a value of the counter and a data width of the at least one piece of write data; and
  when the first piece of write data has been stored to the test data register set completely, transmit a value stored in the test data register set and a value stored in the address register set to the memory interface controller.

3. The joint test action group transmission system of claim 2, wherein in the data receiving status, the second controller is further configured to:
  after the first piece of write data has been stored to the test data register set completely, increment a value of the address stored in the address register set according to the data width and reset the counter;
  determine whether a second piece of write data of the at least one piece of write data has been stored to the test data register set completely according to a value of the counter and the data width; and
  when the second piece of write data has been stored to the test data register set completely, transmit a value stored in the test data register set and a value stored in the address register set to the memory interface controller.

4. The joint test action group transmission system of claim 2, wherein in the address receiving status, when the address has been stored to the address register set, the second controller is further configured to set a value of the counter according to the address.

5. The joint test action group transmission system of claim 4, wherein:
  the data width is X bits and a unit of an address space of the memory is Y bits;
  in the address receiving status, a value of the counter is set to a product of Y and a value of last Z bits of the address; and
  X, Y, and Z are positive integers, and X equals to a product of $2^Z$ and Y.

6. The joint test action group transmission system of claim 5, wherein:
  the second controller determines that the first piece of write data has been stored in the test data register set completely when a value of the counter equals to X minus 1.

7. The joint test action group transmission system of claim 5, wherein:
  the first piece of write data comprises P sets of Y bits of effective values, wherein P equals to $2^Z$ minus the value of the last Z bits of the address; and
  when a value of the test data register set is transmitted to the memory interface controller, the second controller is further configured to transmit $2^Z$ write valid signals to the memory interface controller to mark effective bits of the P sets of Y bits in the test data register set.

8. The joint test action group transmission system of claim 7, wherein:
  each of the $2^Z$ write valid signals has a first value by default;
  in the data receiving status, when a value of the counter equals to a product of Y and n minus 1, the second controller is further configured to change a value of an $n^{th}$ write valid signal to be a second value; and
  n is an positive integer smaller than or equal to $2^Z$.

9. The joint test action group transmission system of claim 2, wherein:
  when the host unit has the test access port circuit leave the data shift status and enter a data updating status, the second controller completes the data receiving status.

10. The joint test action group transmission system of claim 1, wherein:
  the data package further comprises a data length value;
  the test access port circuit further comprises a data length register set; and
  the second controller is further configured to:
    when the address receiving status completes, enter a length value receiving status;
    in the length value receiving status, increment the counter when the clock terminal receives the clock signal;
    determine whether the data length value has been stored to the test data register set completely according to a value of the counter and a value width of the data length value; and
    when the data length value has been stored to the test data register set completely, store a value stored in the test data register set to the data length register set, reset the counter, and enter the data receiving status.

11. The joint test action group transmission system of claim 10, wherein:
  after the second controller determines that the at least one piece of write data has been received completely according to the data length value, the second controller completes the data receiving status.

12. The joint test action group transmission system of claim 10, wherein:
  when the host has the test access port circuit leave the data shift status and enter a data updating status, the second controller completes the length value receiving status.

13. The joint test action group transmission system of claim 1, wherein the first controller comprises a finite state machine, and the second controller comprises a finite state machine.

14. A joint test action group (JTAG) transmission system comprising:
  a slave unit comprising:

a test access port (TAP) circuit comprising a data input terminal, a clock terminal, a mode selection terminal, and a test data register set a memory; and a memory interface controller coupled to the test access port circuit and the memory, and configured to store data transmitted from the test access port circuit to the memory; and a host unit coupled to the data input terminal, the clock terminal, and the mode selection terminal, and configured to transmit a download instruction set to the test access port circuit to have the test access port circuit select the test data register set, and have the test access port circuit enter a data shift status to receive a data package through the test data register set;

wherein:

the data package comprises an address, at least one piece of write data, and a checking code; and during a process of receiving the data package, the test access port circuit remains in the data shift status to continuously receive the address and the at least one piece of write data in the data package.

\* \* \* \* \*